(12) United States Patent
Krug et al.

(10) Patent No.: US 7,633,561 B2
(45) Date of Patent: Dec. 15, 2009

(54) INTEGRATED CIRCUIT TELEVISION RECEIVER ARRANGEMENT

(75) Inventors: Erwin Krug, München (DE); Bernd Pflaum, Unterhaching (DE)

(73) Assignee: Infineon Technologies AG, Munich (DE)

( * ) Notice: Subject to any disclaimer, the term of this patent is extended or adjusted under 35 U.S.C. 154(b) by 677 days.

(21) Appl. No.: 11/182,361

(22) Filed: Jul. 15, 2005

(65) Prior Publication Data

US 2006/0038925 A1 Feb. 23, 2006

(30) Foreign Application Priority Data

Jul. 15, 2004 (DE) .................. 10 2004 034 274

(51) Int. Cl.
*H04N 5/44* (2006.01)
*H04N 5/455* (2006.01)

(52) U.S. Cl. .................. 348/725; 348/731; 348/726; 348/707; 455/341

(58) Field of Classification Search .................. 348/725, 348/726, 729, 731, 707; 455/255, 252.1, 455/326, 341
See application file for complete search history.

(56) References Cited

U.S. PATENT DOCUMENTS

| | | | |
|---|---|---|---|
| 4,604,645 A | 8/1986 | Lewis, Jr. | |
| 5,737,035 A | 4/1998 | Rotzoll | |
| 6,377,315 B1 * | 4/2002 | Carr et al. | 348/726 |
| 6,438,361 B1 | 8/2002 | Chong et al. | |
| 7,123,073 B2 | 10/2006 | Nakatani et al. | |
| 7,187,913 B1 * | 3/2007 | Rahn et al. | 455/188.1 |
| 7,362,384 B2 * | 4/2008 | Dauphinee et al. | 348/725 |
| 2001/0027093 A1 | 10/2001 | Krug | |
| 2004/0004674 A1 | 1/2004 | Birleson | |

FOREIGN PATENT DOCUMENTS

| | | |
|---|---|---|
| DE | 101 14 779 A1 | 10/2002 |
| DE | 101 22 830 A1 | 11/2002 |
| EP | 0 777 335 A2 | 6/1997 |
| EP | 1 128 552 A1 | 8/2001 |
| EP | 1 253 721 A2 | 10/2002 |
| GB | 2 342 238 A | 4/2000 |
| JP | 4-343504 | 11/1992 |
| JP | 6-69829 | 3/1994 |
| JP | 2001-156549 | 6/2001 |

(Continued)

*Primary Examiner*—David L Ometz
*Assistant Examiner*—Jean W Désir
(74) *Attorney, Agent, or Firm*—Eschweiler & Associates, LLC

(57) ABSTRACT

According to one or more aspects of the present invention, a receiver arrangement is disclosed that is configured to receive digital television signals. The receiver arrangement has at least one first frequency conversion device with the signal input, a local oscillator input and an output. The at least one first frequency conversion device is designed to convert a signal which is applied to the input side to an intermediate frequency. A first amplifier is also provided and is designed with amplification in order to compensate for the signal level loss in a filter which is connected downstream from the first amplifier. The first amplifier is coupled to the output of the frequency conversion device. An intermediate-frequency amplifier with a variable gain factor is also provided, and is coupled to the first amplifier. At least the at least one first frequency conversion device the first amplifier are formed in a common semiconductor body.

31 Claims, 7 Drawing Sheets

FOREIGN PATENT DOCUMENTS

| | | |
|---|---|---|
| JP | 2001-274715 | 10/2001 |
| JP | 2003-124834 | 4/2003 |
| JP | 2003-134411 | 5/2003 |
| JP | 2003-169265 | 6/2003 |
| WO | WO 01/01573 A1 | 1/2001 |
| WO | WO 02/078200 A2 | 10/2002 |
| WO | WO 03/105335 A2 | 12/2003 |

\* cited by examiner

INTEGRATED CIRCUIT TELEVISION RECEIVER ARRANGEMENT

REFERENCE TO RELATED APPLICATIONS

This application claims the benefit of the priority date of German application DE 10 2004 034 274.1, filed on Jul. 15, 2004, the contents of which are herein incorporated by reference in its entirety.

FIELD OF THE INVENTION

The present invention relates generally to receivers, and more particularly to a receiver arrangement configured to receive digital television signals.

BACKGROUND OF THE INVENTION

The development of digital television distribution services (DVB: Digital Video Broadcast) results in stringent requirements for the receiver, owing to the complex transmission signal. In addition to high frequency selectivity, maintenance of a high degree of linearity is also required in order to avoid errors in the transmitted and received data with the OFDM transmission method that is used. Very good phase noise is of major importance for the reception of digital signals with OFDM modulation, while the noise factor or the signal-to-noise ratio is particularly important for the reception of analog signals. In receivers for digital television signals, an input signal is frequently first of all converted to an intermediate frequency, is filtered and is then processed further. The bandwidth that is used per individual useful channel is admittedly quite narrow, but the totality of the available channels results in a bandwidth of several hundred MHz.

Furthermore, the increasingly widespread use of mobile communication appliances and television has resulted in requirement for new concepts for the design of the receiver for a television tuner which is used in a mobile system. In systems such as these, for example notebooks or laptops, the available space as well as the current and/or voltage supply are limited.

SUMMARY OF THE INVENTION

One object of the invention is accordingly to provide a receiver arrangement which is particularly suitable for television signal reception in mobile communication appliances.

According to the invention, at least one frequency conversion device is in this case provided in a receiver arrangement. This frequency conversion device has a signal input, a local oscillator input as well as an output, and is designed to convert a signal applied to the input side to an intermediate-frequency signal with the aid of a local oscillator signal at the local oscillator input. The output of the frequency conversion device is coupled to a first amplifier, whose gain is suitable to compensate for the signal level loss in a first filter, which is connected downstream from the first amplifier. The first amplifier thus has a gain in order to compensate for the signal level loss. Furthermore, an intermediate-frequency amplifier with a variable gain factor is provided, and is coupled to the first amplifier via the downstream filter. The filter is particularly frequency-selective, and is used to suppress converted but undesirable signal components in the received signal. According to the invention, the at least one frequency conversion device and the first amplifier are in the form of an integrated circuit in a semiconductor body.

The formation of the major components of a receiver arrangement for digital television signal reception in an integrated circuit within a chip allows a space-saving and low-cost configuration, in contrast to a conventional implementation of a television signal tuner with discrete elements. The use of an integrated circuit likewise allows the supply voltage to be reduced to less than 5V, or the choice of the supply voltage preferably between 3V and 5V, by means of the consistent use of integrated circuit technology.

The intermediate-frequency amplifier is preferably also in the form of an integrated circuit in the semiconductor body. Integration means considerably greater flexibility in the use of the receiver arrangement according to the invention. In addition to reception of digital television signals, the arrangement according to the invention can also be used for reception of further communication standards, in particular mobile radio standards. This allows the receiver arrangement to be in the form of a universal receiver, for different communication and data transmission standards.

In one development of the invention, this is made possible by the provision of further frequency conversion devices, which are connected in parallel with the frequency conversion device. Furthermore, a plurality of oscillators with different frequency ranges can also be formed within the semiconductor body, in order to produce local oscillator signals. A suitable switching means connects the local oscillator input of the at least one frequency conversion device to the oscillator which is suitable for the corresponding frequency range. This makes it possible to cover a sufficiently wide frequency range for different applications using the at least one frequency conversion device, in a suitable manner. In particular, this makes it possible to convert input signals to the same intermediate frequency by the choice of the frequency of the oscillator signal. The rest of the signal processing is thus considerably simplified.

In another development of the invention, the first amplifier is coupled via a first filter device to the output of the frequency conversion device. The first filter device is in this case arranged within the semiconductor body or, alternatively, outside the semiconductor body. If it is arranged outside the semiconductor body, the bandwidth or other parameters of the filter device can also be changed subsequently.

In one development of the invention, the at least one frequency conversion device is a Gilbert mixer with a Gilbert cell. In this case, a first and a second control connection of the Gilbert cell are additionally preferably connected to one connection of a first charge store and to one connection of a second charge store. The respective other connection of the first charge store is connected to the first output, and the respective other connection of the second charge store is connected to the second output. The additional cross-coupling of the Gilbert cell with charge stores and preferably with capacitors further improves the intermodulation characteristics of the Gilbert mixer.

In another development of the invention, the first filter device has a supply potential connection, which is coupled via an inductive element to the output of the frequency conversion device. The first filter device thus at the same time forms a supply input for the frequency conversion device.

In another development of the invention, a second filter device with a variable pass band is connected upstream of the signal input of the at least one frequency conversion device. The second filter device has a first and a second control connection for supplying a control signal for adjustment of the pass band. In this case, the second filter device is preferably in the form of a tracking filter outside the semiconductor body. A refinement such as this appears to be expedient owing to the wide frequency range to be covered of several 100 MHz for the receiver arrangement according to the invention.

In one embodiment, the second filter device has at least one capacitance diode with a variable capacitance, whose first connection is coupled to the first control connection, and whose second connection is coupled to the second control connection. In a further embodiment, a charge store for mirror-image frequency suppression is connected between the signal input and the signal output of the second filter device. The signal quality of the intermediate-frequency output signal after frequency conversion is considerably improved in this way. Furthermore, the first and the second control connection are used for precise adjustment of the pass band of the second filter device. In this case, one control connection can be provided for supplying a correction signal, in order in this way to compensate for manufacturing-dependent and component-dependent fluctuations. This makes it possible to avoid the need for mechanical and time-consuming trimming by means of an additional test after completion of the receiver.

In a further form of this embodiment, the first control connection is designed to supply a control signal for adjustment of the pass band, and the second control connection is designed to supply a correction signal for trimming and for correction of the pass band on the basis of the manufacturing and component fluctuations.

In a further development of the invention, the second control connection is coupled to a digital/analog converter for foot-point adjustment. This digital/analog converter is designed to convert a digital correction value to an analog correction signal, and to supply the correction signal to the second control connection. The correction value can preferably be stored in a memory which can be read from and written to. Various correction values are preferably determined, and are stored in the memory, during a manufacturing phase. During operation, these correction values can be used to correct and to trim the second filter device. There is therefore no need for mechanical trimming. Furthermore, this refinement of the receiver arrangement according to the invention is independent of component fluctuations from upstream filters.

In another embodiment, the filter which is connected downstream from the first amplifier is in the form of a surface filter. Alternatively, it can also be in the form of an active tunable RC filter with low-pass or a bandpass filter characteristic. In this case, it may be formed outside or inside the semiconductor body. In a further embodiment, the filter which is connected downstream from the first amplifier has a control input for supplying a control signal for switching the filter bandwidth.

A switchable filter bandwidth allows the use of the receiver arrangement according to the invention not only for a television signal but also for other mobile communication standards which are characterized by different signal bandwidths. Instead of a single filter, it is also possible to use different filters with different characteristics, for example with a different pass band characteristic, bandwidth, and mid-frequency. It is then appropriate to connect a switching device upstream, which connects one filter in the filter bank to the signal path as a function of the signal to be processed.

In another development of the invention, the adjustment signal is used for adjustment of the pass band of the second filter device and for adjustment of the pass band of the tracking filter, which is connected upstream of the frequency conversion device, also for adjustment of the local oscillator signal for the at least one frequency conversion device.

For this purpose, in one refinement of the invention, at least one first voltage controlled oscillator is provided, whose output signal connection is coupled to the local oscillator input of the at least one first filter device. The oscillator is thus designed to produce the local oscillator signal. A control input of the voltage controlled oscillator can be supplied with a signal for adjustment of the local oscillator signal, with the signal being derived from the second control signal for the second filter device. This control signal is preferably derived from a phase locked loop which is connected to the output signal connection of the voltage controlled oscillator.

Thus, in one development, a phase locked loop is provided, which produces a control signal both for closed-loop control of the voltage controlled oscillator and for open-loop control of the pass band of the second filter device. The phase locked loop is preferably likewise in the form of an integrated circuit in the semiconductor body.

In another development of the invention, an input amplifier with a continuously variable gain is connected upstream of the second filter device. This input amplifier has a control input for gain adjustment. The input amplifier is used to amplify received signals to a level which is sufficient for the rest of the signal processing, and at the same time to compensate for any attenuation by the downstream second filter device.

In another refinement of the invention, the first amplifier is coupled within the semiconductor body to a level detector, which is designed to emit a control signal in order to adjust the gain of the input amplifier. The level detector can thus be used to detect a signal level, with the control signal for the gain adjustment of the input amplifier being adjusted optimally as a function of this.

In another development of the invention, the frequency conversion device is designed to emit a signal which represents an input signal level to a circuit for production of a control signal to the input amplifier. Two signal levels are thus preferably detected at different points in the signal path within the semiconductor body, with the signal which is emitted from the frequency conversion device representing a broadband level signal, and the level detector which is connected to the first amplifier producing only one narrowband level signal.

In one preferred refinement, in order to produce a signal which represents the input signal level, the at least one frequency conversion device has two controlled paths which are connected between a first and a second potential. Their control connections are connected to the signal input of the frequency conversion device. Furthermore, the respective first and second connection of the first and second controlled paths are coupled to a control value detector in order to form a broadband signal which represents an input signal level.

The broadband signal which represents the input signal level as well as the narrowband signal coming from the level detector are preferably processed in a control circuit which uses them to produce a control signal for gain adjustment. In one development of the invention, the signal which is produced for gain adjustment is supplied to the intermediate-frequency amplifier in order to adjust its gain.

In another development of the invention, a second frequency conversion device is provided in addition to the at least one frequency conversion device. This second frequency conversion device is formed within the semiconductor body, and its local oscillator input is connected to a further voltage controlled oscillator within the semiconductor body. The signal input of the second frequency conversion device is itself coupled to a further tracking filter outside the semiconductor body. The second frequency conversion device is also equipped in the same way with a broadband level detector for detection of a signal level applied to the input side.

The receiver arrangement according to the invention is preferably used in a receiver for digital television signals, and in particular for terrestrial digital television. The formation of a number of components as an integrated circuit in a semiconductor body reduces the required space.

In particular, the physical height is reduced by the use of surface mounted devices, for example SMD coils. Owing to the low voltage that is used and the low power consumption, the present receiver arrangement is particularly suitable for use in mobile appliances, for example in notebooks, PDAs or mobile telephones.

The supply and production of a correction signal from correction values which are stored in a memory means that there is no need for additional mechanical trimming during the manufacture of the receiver arrangement according to the invention, thus making it possible for the components that are required for the filter to be in the form of space-saving SMD elements. This reduces the production costs. The correction values may be determined in advance in a suitable measurement process, and may be stored in the memory.

BRIEF DESCRIPTION OF THE DRAWINGS

The invention will be explained in detail in the following text with reference to the drawings. Components which operate in the same way or have the same effect have the same reference symbols in the individual figures, in which.

DETAILED DESCRIPTION OF THE INVENTION

Figure 1:
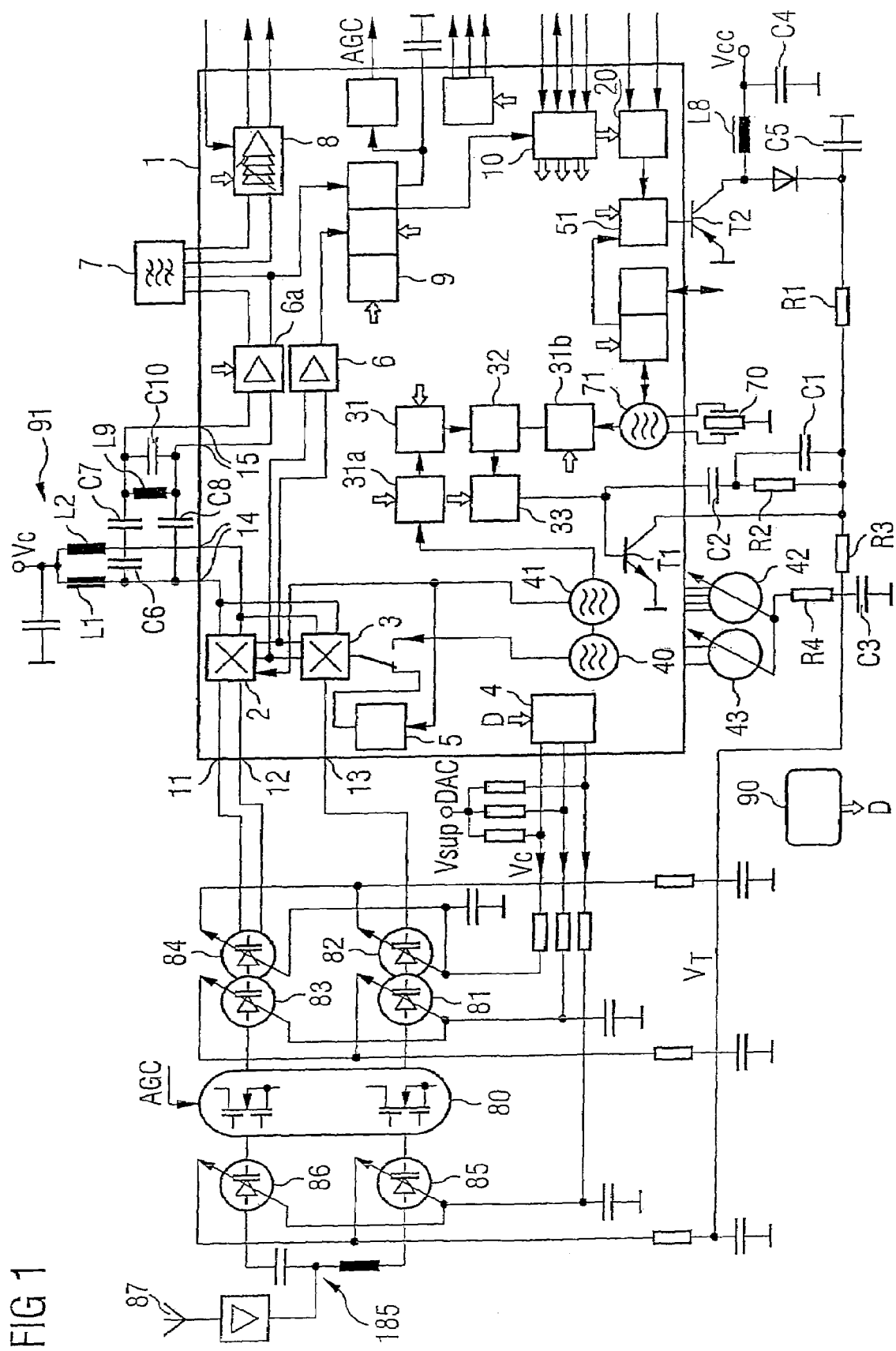
FIG. 1 shows one exemplary embodiment of a receiver arrangement according to the invention.

FIG. 1 shows one exemplary embodiment of a receiver arrangement according to the invention for the reception and signal processing of two frequency bands. The structure of this receiver arrangement may, however, be extended by arranging further receiver paths in parallel, so that different frequency bands can be received. In the arrangement according to the invention, two or more components are implemented in a common semiconductor body 1, which in the exemplary embodiment is produced using silicon semiconductor technology. The components are thus in the form of integrated circuits in a single semiconductor body. The semiconductor body 1 has two or more connections on its surface, and these are referred to as contact pads. The contact pads are connected via lines to discrete components. At the same time, the contact pads lead to the individual integrated circuits of the receiver arrangement within the semiconductor body.

The receiver arrangement in the exemplary embodiment contains a phase locked loop in the semiconductor body 1, which phase locked loop is coupled to the two voltage controlled oscillators 40 and 41. The two voltage controlled oscillators 40 and 41 are likewise connected to one another, so that the signals which are emitted from them at their outputs have a fixed relationship to one another. Furthermore, the voltage controlled oscillator 41 emits its output signal to a first frequency divider 31a, which is itself connected to a second frequency divider 31. Control inputs to the two frequency dividers 31a and 31 allow adjustment of the corresponding division ratio. The divided signal is supplied to a phase comparator 32, which compares the phase with a reference phase.

The reference phase is in this case obtained from a reference oscillator 71, whose output signal is likewise supplied to the phase detector 32, via a further frequency divider 31b. The reference oscillator 71 is likewise arranged within the semiconductor body 1 and is coupled to a timer 70, which in the exemplary embodiment is in the form of an externally arranged crystal oscillator.

One output of the phase comparator 32 is connected to a charge pump 33, which itself produces a control signal for adjustment of the output frequency of the voltage controlled oscillators 40 and 41. This is done by the signal which is emitted from the charge pump 33 on the one hand being applied to the control connection of a transistor T1, and additionally being supplied via a first capacitor C1, which is arranged outside the semiconductor body 1, to a resistor R2. The collector connection of the bipolar transistor T1 leads to the second connection of the resistor R2. A further capacitor C1 is arranged in parallel with the resistor R2. The signal is supplied via further loads R3 and R4 to the controlled units 42 and 43, which are in the form of oscillator tanks and have control inputs for adjustment of the output frequency of the oscillators 40 and 41. The tanks 42, 43 are likewise arranged outside the semiconductor body 1 and produce control signals for adjustment of the output signal.

The output of the voltage controlled oscillator 40 is connected to the local oscillator input of the frequency conversion device 3. The signal output of the oscillator 41 is connected to the local oscillator input of a second frequency conversion device 2. The two frequency conversion devices 2 and 3 are also referred to as mixers, and convert a signal which is applied to the connections 11, 12 and 13 on the input side to an intermediate frequency. The mixer 2 is in this case connected on the input side to the two connecting contacts on the upper face of the semiconductor body 1, and is designed for differential signal processing. In contrast to this, the signal input to the connecting pad 13 is supplied with a single-ended signal, which is converted by the second mixer 3 to a difference signal at an intermediate frequency.

At the same time, the output of the voltage controlled oscillator 41 is connected to a frequency divider circuit 5. The output of this frequency divider circuit 5 is likewise switchably coupled to the local oscillator input of the second mixer 3. The oscillator 41 has a frequency range in the UHF band, via the adjustment signal at the tank 43. The frequency range of the UHF band corresponds to three times the frequency range of the VHF-III band. Thus, if the frequency is divided by a factor of 3, the output signal from the oscillator 41 can be used not only for frequency conversion of signals in the UHF band, but also for frequency conversion of signals in the VHF-III band. The arrangement of the two voltage controlled oscillators 40 and 41 and the additionally provided frequency divider circuit 5 makes it possible to convert signals applied on the input side in a wide frequency range to the same intermediate frequency. In this case, the oscillator circuits 40 and 41 have different frequency tuning ranges.

The proposed concept likewise allows the provision of oscillators with a considerably wider tuning range, and the capability to obtain the required local oscillator signals for the desired frequency bands by frequency multiplication or frequency division. In this case, it is possible to use not only the circuit described here with the division factor of 3, but also fractional division factors.

The intermediate frequency signal outputs of the two mixers 2 and 3, which are formed using push-pull signal processing, are connected to the contact pads 14 on the surface of the semiconductor body 1. These are in each case connected via two coils L1 and L2 to a first supply potential Vc. The supply potential Vc is thus used to supply the two mixers 2 and 3. At the same time, a further capacitor C6 is connected in parallel between the two connecting contact pads 14. The two coils L1 and L2 act as a filter for shielding the supply potential connection Vc from radio-frequency signal components that have been converted to the intermediate frequency. In addition, the connecting contact points are connected to the capacitors C7 and C8, each of whose second connections are coupled via the coil L3 and the capacitor C9 connected in parallel with it.

The arrangement of the coils L1, L2 and L10 and of the capacitors C6, C7, C8 and C9 forms an external bandpass filter. The outputs of the second-order external bandpass filter are connected to the connecting contacts 15, which are connected to a first amplifier 6a arranged in the semiconductor body 1. The first amplifier 6a is used to compensate for any signal level loss in the downstream surface acoustic wave filter 7. For this purpose, it has a high degree of linearity for the entire level range. The surface acoustic wave filter 7 is formed outside the semiconductor body 1. The external arrangement allows particularly simple trimming and, if appropriate, simple replacement and adjustment capabilities for the bandwidth and the pass band of the surface acoustic wave filter 7. Replacement allows simple support for different television standards, for example PAL, NTSC or SECAM-L. It is thus possible to connect in parallel two or more filters which are optimized for different standards. The attenuation caused by the surface acoustic wave filter 7 within the pass band of, for example, 5 to 20 dB is compensated for by the upstream driver amplifier 6a.

The outputs of the surface acoustic wave filter 7 are connected to further contact pads on the surface of the semiconductor body 1, and lead to the inputs of the intermediate frequency amplifier 8. This has a variable gain factor, which is adjusted via an externally supplied signal AGC. The gain is in this case adjusted in continuous steps to a level which offers a high degree of linearity with a very good signal-to-noise ratio at the same time. The output signal from the intermediate-frequency amplifier 8 forms the signal output from the receiver arrangement 1 according to the invention. Furthermore, the amplifier 8 can be switched off and/or its power consumption can be reduced, by means of specific signals. This allows the current drawn to be reduced in some operating modes.

Furthermore, components and integrated circuits are provided within the semiconductor body 1 for production of a signal for gain adjustment AGC. The mixers 2 and 3 thus produce output signals which are supplied to the amplifier 6. These output signals represent a signal level for signals which are applied with a broad bandwidth on the input side. The signal level is supplied to a device 9 for calculation of the optimum gain setting. At the same time, the output of the first amplifier 6a is also connected to this device 9. In this case, the level of the output signal from the amplifier 6a is not the same as the level of the signals which are applied to the contact pad 13 on the input side, since the broadband signal that has been converted to the intermediate frequency is correspondingly suppressed down to the pass band by the first external filter. In contrast to the signal from the amplifier 6, which represents the level of the broadband signal, the output signal from the amplifier 6a has relatively narrow bandwidth. The circuit 9 can use the various control signals to produce a corresponding adjustment signal for gain adjustment.

Furthermore, monitoring and control elements as well as supply elements are also accommodated in the semiconductor body. These are, on the one hand, monitoring elements in the circuit 10 for controlling the I2C bus as well as supply circuits 20. The supply circuits 20 ensure the electrical power supply for the individual elements, for example for the phase locked loop and for the voltage controlled oscillators. The monitoring element 10 produces the control signals which are required for the frequency dividers in the phase locked loop.

The inputs of the two mixers 2 and 3 are respectively connected to two series-connected tracking filters 81 and 82, as well as 83 and 84. The two series-connected tracking filters have a tunable pass band. In this case, they are tuned, inter alia, via the control signal which is produced by the phase locked loop in the receiver arrangement according to the invention. Furthermore, additional circuits 51 are provided within the semiconductor body 1, are fed from the supply element 20 and are connected to the reference oscillator 71. The circuits 51 form DC/DC converters for DC voltage signals. This additional voltage shift, which can move in the range up to 33V, is provided by the additional DC/DC converter 51 and a charge pump. The converters may, for example, be formed with the aid of charge pumps. In the exemplary embodiment, the reference signal of the oscillator 71 produces a suitable square-wave signal, which is supplied to the base of the transistor T2. The externally arranged charge stores C4 and C5, the coil L8 arranged in between them and the diodes form the charge pump, which is operated such that it is clocked by the signal emitted from the transistor T2. They produce the wide voltage shift and ensure a stable voltage.

Furthermore, in addition to this adjustment signal, a further correction signal is produced in order to correct the pass band of the tracking filters. The correction signal is produced by a digital/analog converter 4 which is arranged within the semiconductor body 1. The digital/analog converter 4 uses a number of correction values to produce analog correction signals which are supplied to the tracking filters 81, 82, and 83, 84. The correction values can in this case be obtained from an externally arranged EPROM memory 90, and are supplied to the DACs 4 via a data bus D. The memory 90 may, of course, also be arranged within the semiconductor body. Additional correction values and/or correction signals are required in order to compensate for component fluctuations during production.

An amplifier circuit 80 is connected upstream of the inputs of the two tracking filters 81, 82 and 83, 84. The inputs of the amplifier circuit 80 are connected to the outputs of further tracking filters 85 and 86. These two tracking filters 85 and 86 also have a tunable frequency range. The control signals are once again produced by the semiconductor body 1 via the circuit 51 and/or the phase locked loop, and are supplied together with additional correction signals from the digital/analog converter 4 to the tracking filters 85 and 86. The two inputs of the tracking filters 85 and 86 are coupled to the antenna 87 via a diplexer 185, which is indicated by a coil and a capacitor connected in series with it. The diplexer acts as a frequency splitter for separation into two frequency ranges.

In the exemplary embodiment, an LNA amplifier is also connected between the diplexer 185 and the antenna 87. This may be connected in the signal path, or may be bypassed and/or its gain may be variable, for example by means of the signal AGC, such that low input levels are amplified right at the input, which is advantageous to the signal-to-noise ratio, while high input levels are passed to the diplexer without being amplified. In addition, this amplifier may also be used as matching to the antenna 87. If, as described above, the receiver arrangement is designed for signal processing in further frequency bands, then a triplexer or some other suitable switching element may be used instead of the diplexer.

The coil and capacitor act as a frequency splitter, which applies the high-frequency components of the received signal to the input of the tracking filter 86. Low-frequency components of a received signal are supplied via the coil to the input of the tracking filter 85. The tracking filters 86, 83 and 84, which are connected to the two inputs 11 and 12 for the mixer 2 on the surface of the semiconductor body, are thus designed in particular for processing high-frequency signal components. Low-frequency components are passed via the filters 85 and 81, 82 to the single-ended signal input 13. This simple refinement allows a wide frequency range, and thus different input signals, to be processed by connecting a number of tracking filters in parallel.

In the exemplary embodiment for the receiver arrangement according to the invention as shown in FIG. 1, the upper signal path is designed primarily for signals in the UHF range. The lower signal path is used for processing VHF-III signals. UHF and VHF signals in this case represent frequency ranges for the reception of digital television signals. Because of the frequency splitter circuit 5, the oscillator signal from the oscillator 41 can be used as the local oscillator signal for both frequency ranges. Signal processing for other frequency bands is also possible by connecting further tracking filters and mixers in parallel.

Figure 2:
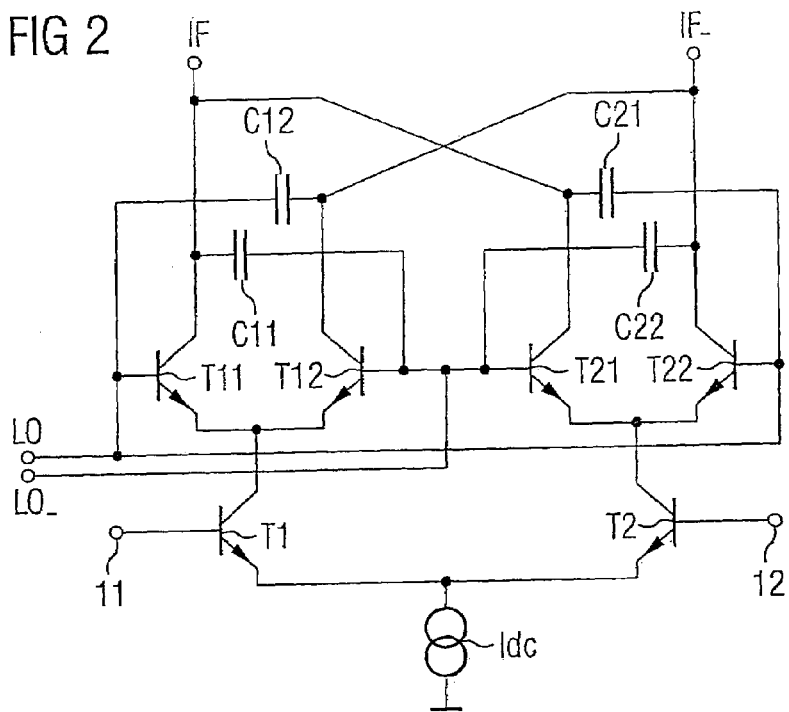
FIG. 2 shows a first exemplary embodiment of a frequency conversion device.

For reception of digital and, in particular, terrestrial digital television signals (DVB-H, DVB-T), it is expedient not to convert received signals directly to baseband for further baseband signal processing, but first to convert them to an intermediate frequency. This is necessary in order to comply with the stringent signal quality requirements relating to linearity and adjacent channel suppression. A first exemplary embodiment of a mixer for frequency conversion of radio-frequency signals in the UHF or VHF band to an intermediate frequency is shown in FIG. 2.

This figure illustrates a Gilbert mixer with a Gilbert cell formed from bipolar transistors T11, T12 and T21, T22 together with the bipolar transistors T1 and T2, which form a differential amplifier. The control connections of the Gilbert cell are supplied with the local oscillator signal LO as a push-pull signal with the two components LO and LO-. The control connections of the transistors T1 and T2 form the input connections for the radio-frequency signal, which are connected to the connections 11 and 12 on the surface of the semiconductor body according to the invention. The mixer collector connections of the transistors in the Gilbert cell are in this case supplied via the external coils L1 and L2 with the necessary supply voltage from the supply potential Vc as shown in FIG. 1. This increases the drive range and the intermodulation characteristics even for low supply voltages. At the same time, intermodulation products are reduced, and the dynamic response is improved. Intermodulation occurs as a result of the limited and non-linear behavior of the transistors at high input signal levels.

Furthermore, cross-coupling is provided with the capacitors C11, C12 and C21, C21. In this case, the first connection of each of the capacitors C12 and C21 is connected to the local oscillator connection LO, and the respective other connection of the two capacitors C12 and C21 leads to one of the two intermediate-frequency signal outputs IF or IF-, respectively. In the same way, one connection of each of the two capacitors C11 and C22 is connected to the local oscillator connection LO-, and the respective other connection is connected to the intermediate-frequency signal output.

Figure 3:
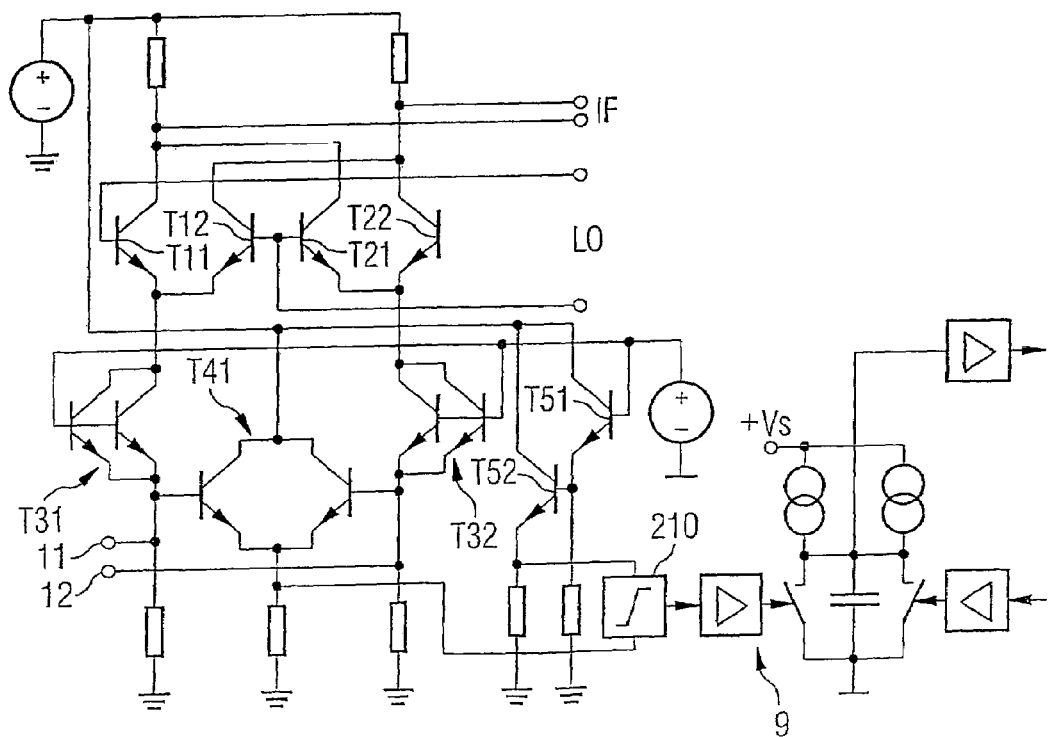
FIG. 3 shows a second exemplary embodiment of a frequency conversion device with a broadband level detector.

FIG. 3 shows another refinement of a mixer. This additionally contains a tap for detection of the levels of signals applied to the input side. As indicated in FIG. 1, this makes it possible to detect a sum level of all the broadband signals which are applied to the input side and are not suppressed by the upstream filters.

In this case, the radio-frequency signal is supplied to the collector connections of every alternate parallel-connected transistor T31 and T32. At the same time, it is applied to the control connections of two bipolar transistors T41a and T41. The emitter connections of the two bipolar transistors T41a and T41 are connected via a resistor to a ground potential, and their collector connections are connected to a supply potential. The control connections of each of the two transistors T31 and T32 are likewise connected to a voltage supply. The collector connections lead to the emitter connections of the Gilbert cell, which is formed from the four transistors T11, T12 and T21, T22.

Furthermore, the collector connections of the transistors T41a and T41b are connected to the collector connections of an amplifier circuit formed by the two transistors T51 and T52. The emitter of the transistor T52 is connected to a first connection of a threshold value detector. The emitter connections of the transistors T41a and T41b are connected to the second connection of the threshold value detector. The resultant signal makes it possible to deduce the level of the applied radio-frequency signal. This is processed further and controls the amplifier setting of the input amplifier 80.

Figure 4A:
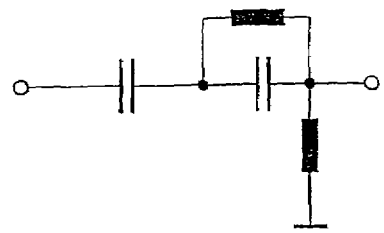
FIG. 4 shows exemplary embodiments of the first filter device.
Figure 4B:
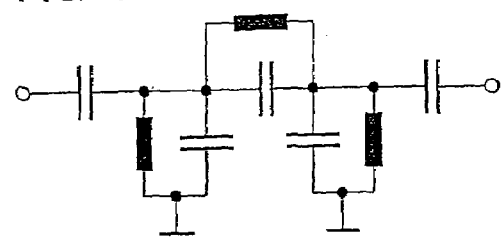
Figure 4C:
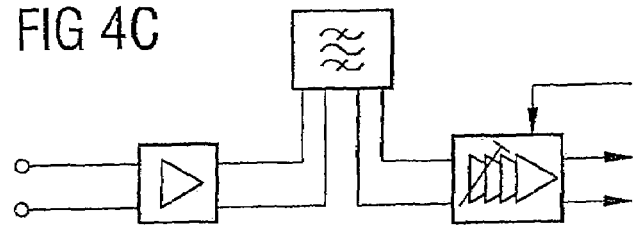

The external arrangement of the filter arrangement 7 allows a choice of the filter type, as well as greater design flexibility. Different filter types with low-pass and bandpass filter characteristics are shown in FIG. 4. In addition to a surface acoustic wave filter as shown in the figure element 4c, it is also possible to use an external LC filter. An external bandpass filter composed of an inductance and a capacitance connected in parallel with it is shown in the figure element 4a. A further capacitor is connected upstream of the filter, for decoupling.

The figure element 4b shows a corresponding higher-order bandpass filter in which, once again, a capacitor is connected upstream of the input to the filter, for decoupling. In particular, it is possible to use a corresponding filter by means of suitable measures, whose tuning range, adjustment range and filter bandwidth can be varied by means of variable capacitances. This means that the receiver arrangement according to the invention can be used not only for digital television signal reception, but also for further mobile radio standards, such as WLAN, Bluetooth or WCDMA/UMTS.

Figure 5:
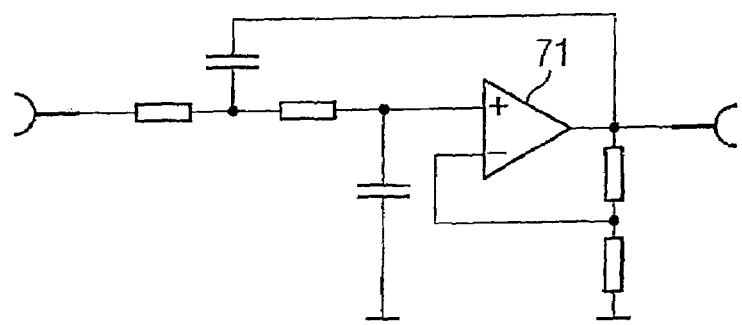
FIGS. 5 and 6 show further exemplary embodiments of the first filter device with a low-pass or bandpass filter characteristic.
Figure 6:
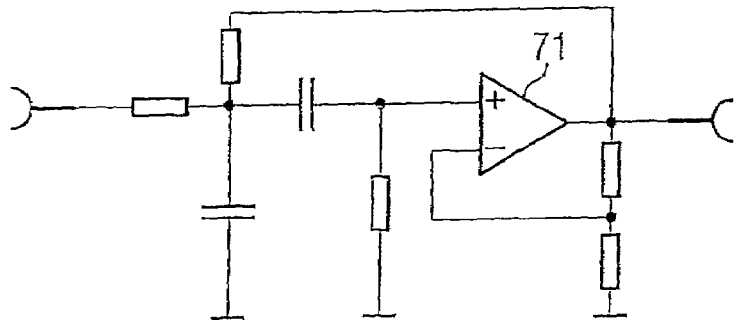

Furthermore, in portable or mobile systems such as notebooks or mobile telephones, it is possible for this channel filter to be in the form of an integrated RC filter on the semiconductor body. FIG. 5 and FIG. 6 show various examples relating to this.

In this case, FIG. 5 shows an RC low pass filter, in which the non-inverting input of a differential amplifier 71 forms the signal input, via a resistor. The inverting input connection of the differential amplifier is fed back via a resistor to the output. The output at the same time also forms the signal output of the low-pass filter. Furthermore, a capacitor is provided, connected between the output and the non-inverting input. A further capacitor connects the non-inverting input to ground potential. This capacitor is used for suppressing and short-circuiting the noise component on the signal line.

FIG. 6 shows a modification of this circuit, in order to form a filter with a bandpass characteristic. In this case, the input connection of the filter is connected via a capacitor to the non-inverting input of the differential amplifier 71. A resistor is also connected between the output and the non-inverting input. In order to compensate for component tolerances in the capacitors and the resistors, and thus to comply with the required frequency responses of the filter, it is possible to use trimmable capacitances and resistances. In this case as well, tuning is possible by means of additional correction signals, which are stored as correction values in the memory 90.

Figure 7:
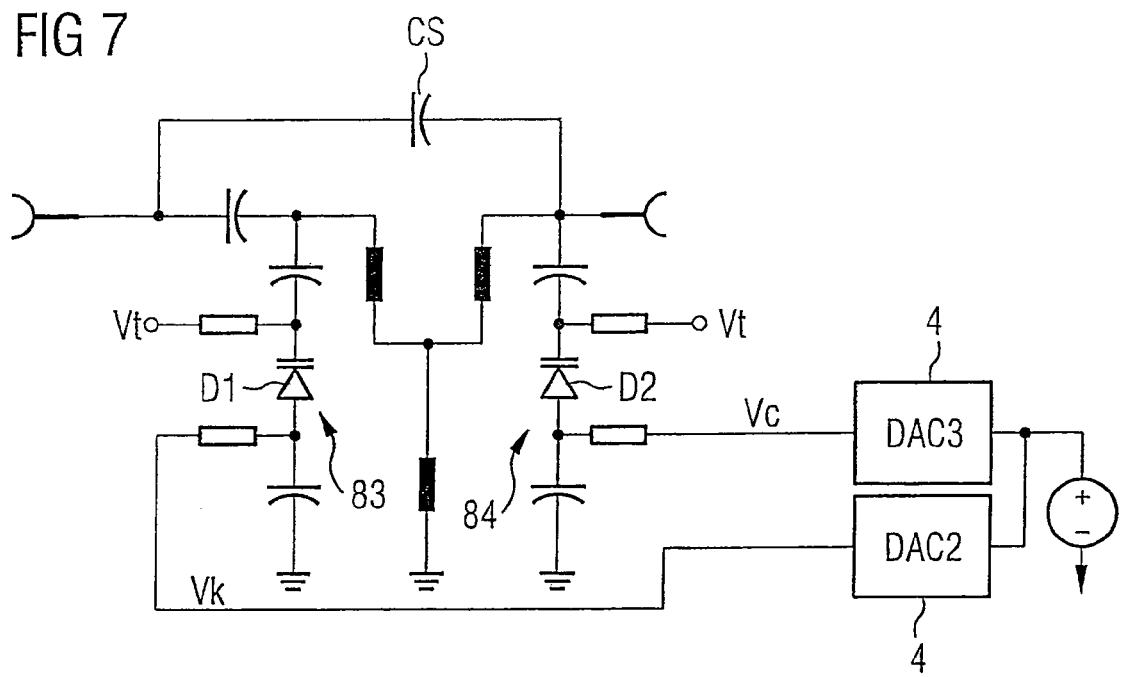
FIG. 7 shows one exemplary embodiment of an external tracking filter.

A further advantage is the high selectivity of the tracking filter at the input of the receiver. In this case, the filter structures 85, 86 as well as 81, 82 and 83, 84 allow, in particular, a high degree of interference signal suppression in the adjacent channels, by virtue of their selectivity. The filters reduce the linearity requirements for the mixers 2 and 3, since the sum level of signals applied to the input side of the mixers is reduced, thus advantageously reducing the power consumption for mobile applications. FIG. 7 shows one embodiment of the two series-connected tracking filters 81, 82 and 83, 84.

In this case, the signal input is connected to the output via a series-connected capacitor as well as two coils. Furthermore, a further capacitor CS is connected in parallel between the input and output, in order to suppress the mirror-image frequency. The pass band and the frequency response of the tracking filters can be adjusted by means of foot-point control using the diodes D1 and D2, which are each arranged between two capacitors. The cathode connection of each diode D1 and D2 is connected to ground potential via a capacitor in each case. The anode connection of the diode D2 is connected via a capacitor to the output tap of the filter. The anode connection of the diode D1 is connected via a capacitor to the connection of the capacitor C12.

Furthermore, the anode connections of the two diodes D1 and D2 are connected to the control signal connection for supplying a first control signal Vt. The control signal Vt is produced by the step-up converter 51 and the phase locked loop within the semiconductor body. This results in the two diodes D1 and D2 having a specific capacitance to ground potential, and thus also in a defined pass band. In order to correct this pass band, each of the cathode connections between the cathode connection and the capacitor is connected to an output connection of a digital/analog converter 4, and these digital/analog converters 4 are referred to as the DAC3 and the DAC2. The digital/analog converters DAC2 and DAC3 use correction values to produce, independently of one another, an analog correction signal Vk for precise adjustment of the pass band. In this case, a specific digital/analog converter is used for each diode D1 and D2. Use of different individual converters in this way is worthwhile when component fluctuations in the capacitances and the coils lead to a variation in the pass band.

Further refinements of tracking filters whose pass band can be varied by means of correction signals are disclosed in the document EP-A-1128552.

Figure 8:
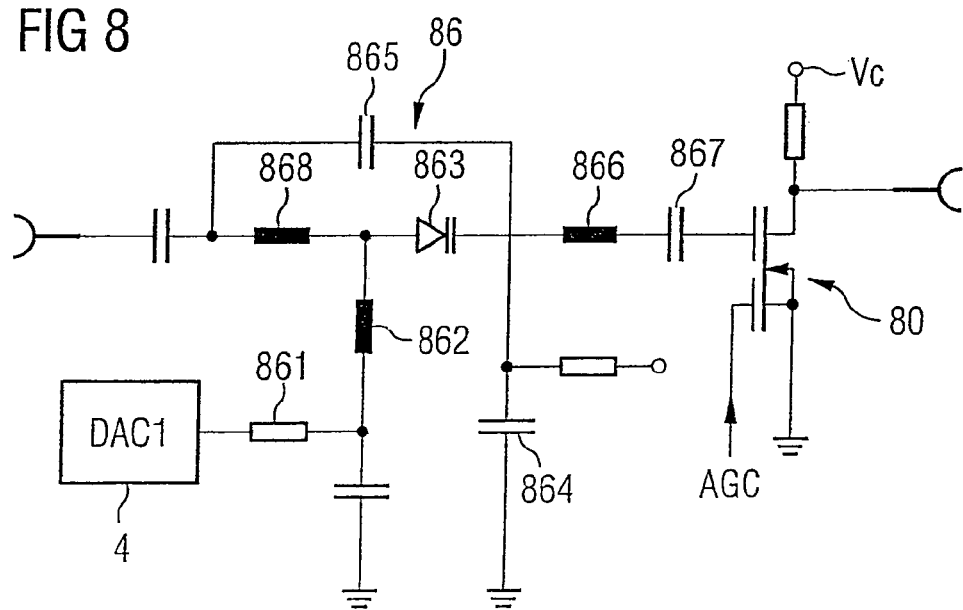
FIG. 8 shows a second exemplary embodiment of a tracking filter with a downstream amplifier.

FIG. 8 shows a further exemplary embodiment of a tracking filter 86 with foot-point control. In this case, the output of the tracking filter is connected to the input for the input amplifier. The foot-point control is in this case carried out by supplying an appropriate analog signal from the digital/analog converter DAC1 via a resistor 861 and a coil 862 to the cathode connection of a diode 863. The anode connection of the diode 863 is connected via a first capacitor 864 to ground potential, and via a second capacitor 865 and a further coil 868 to its cathode connection. Furthermore, the anode connection is connected via a coil 866 and a capacitor 867 to the control connection of the amplifier 80. This amplifier 80 has two dual-gate field-effect transistors, one of which is shown here. One control connection is connected to the capacitor 867, and is supplied with the filtered input signal. The control signal AGC is applied to the second control connection, in order to control the gain setting of the dual-gate MOSFET.

It is expedient to tune the tracking filters 83, 84 and 81, 82 with the respective input filter 86 or 85. This results in the necessary correction values to achieve an optimum being decreased. The DACs 4 used in the example have a resolution of 8 bits, thus resulting in a specific step width in the output voltage, as a function of the reference voltage of the DACs. Since the capacitance of the Varactor diode has a tuning gradient which is typical for the channel and varies as a function of the frequency, it may be necessary to modify the corresponding monitoring signal in the digital/analog converter. This may be done, for example, by varying the stepwidth of the DAC, or else by means of readjustment of the reference voltage. This always makes it possible to achieve an optimum stepwidth and resolution in a simple manner. The adjustment range and sensitivity of the Varactor diode are utilized optimally.

Figure 9:
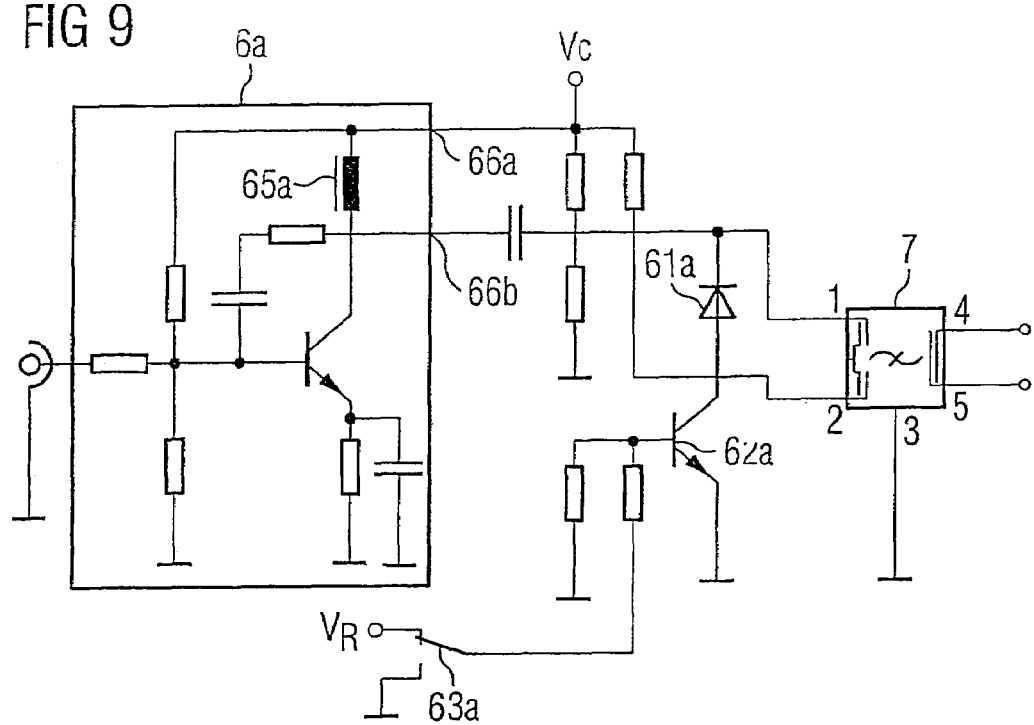
FIG. 9 shows one exemplary embodiment of a first amplifier with a downstream filter.

FIG. 9 shows a further refinement, in which the first amplifier 6a in the receiver arrangement is shown, with the downstream external filter device 7. The amplification device 6a is used as a driver for the downstream filter 7 and has a bipolar transistor connected in a common-emitter circuit with feedback. The emitter is connected to ground potential via a resistor and a capacitor connected in parallel with it. The base forms the signal input, and is also coupled via a further capacitor and a resistor to the collector connection. The collector output of the bipolar transistor in the amplifier 6a is connected to an anode connection of a diode 61a, and to an input 1 of the filter 7. The second input of the filter 7 is connected to the cathode connection of the diode 61a, and is at the same time connected to the supply potential Vc. Furthermore, a second input 2 of the filter 7 is connected via a coil 65a to the collector connection of the bipolar transistor in the amplifier circuit 6a, and to the collector connection of the bipolar transistor 62a.

The base of the bipolar transistor 62a is connected to a switch 63a, which has two possible states. In the first state, it applies the voltage Vr to the base, while in the second state it applies ground potential to the base. In the case of outputs which are clocked in the same way, as is the case by way of example at the output 66a and 66b of the amplifier circuit 6a shown in FIG. 9, this allows bandwidth switching of the filter device 7, using simple means, via the switch 63a and the bipolar transistor 63a that is provided for this purpose.

Figure 12A:
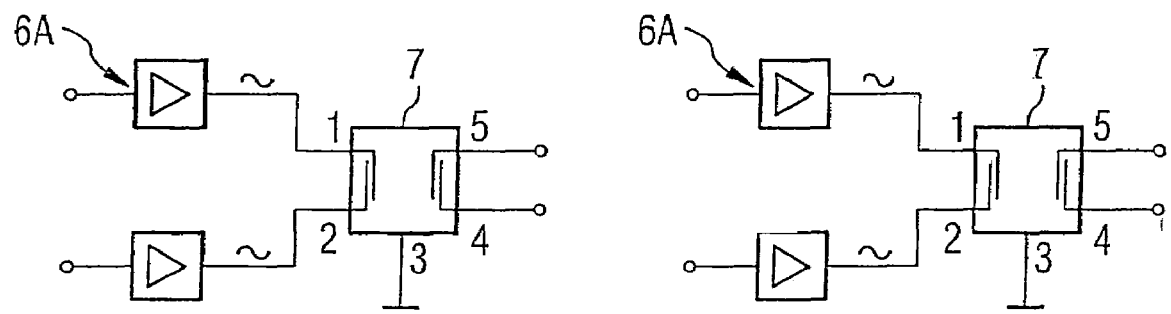
FIG. 12 shows exemplary embodiments of the first amplifier with a downstream filter.
Figure 12B:
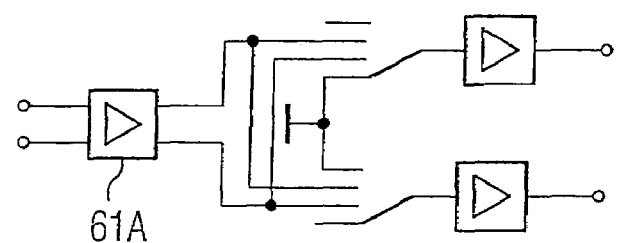

As shown in FIG. 12, the amplifier circuit 6a can be used in a suitable form both for common-mode operation and for differential-mode operation. This is useful when using specific surface acoustic wave filters 7 whose bandwidth switching is carried out by changing from push-pull to single-ended signal processing rather than by the application of a control signal as described in FIG. 9.

Two amplifier elements can be seen in the figure element 12A, and together form the amplifier stage 6a. The current drawn by the amplifier elements and the overall amplifier 6a can be reduced. This allows the current drawn in the semiconductor body 1 to be reduced. The outputs of each amplifier element are connected to the respective inputs 1 and 2 of the surface acoustic wave filter 7. This filter is designed such that a single-ended signal, that is to say the same phase at each of the inputs 1 and 2, leads to a specific pass curve, and produces a specific filter characteristic. A push-pull signal, which is applied to the inputs of the filter 7, leads to a different transmission characteristic and, for example, to a different bandwidth. The figure element 12B shows a matrix circuit which makes it possible to change between common-mode signal processing and differential-mode signal processing. According to the figure element 12a, the push-pull signal coming from the mixers and the filter 91 is supplied, after amplification in a switching matrix, to a first amplifier element 61A.

This switching matrix contains two switches, which can assume a number of switch positions. A push-pull signal or a single-ended signal can therefore be supplied to the inputs of the downstream amplifier elements, depending on the switch position. In addition, there is one switch position in which one input is connected to ground potential. This has the same effect as supplying a control signal of 0 volts, in the same way as in the embodiment shown in FIG. 9. The circuit illustrated in FIG. 12 can thus be used not only for a surface acoustic wave filter in the embodiment shown in FIG. 9, but also in the embodiment shown in FIG. 12.

Figure 10:
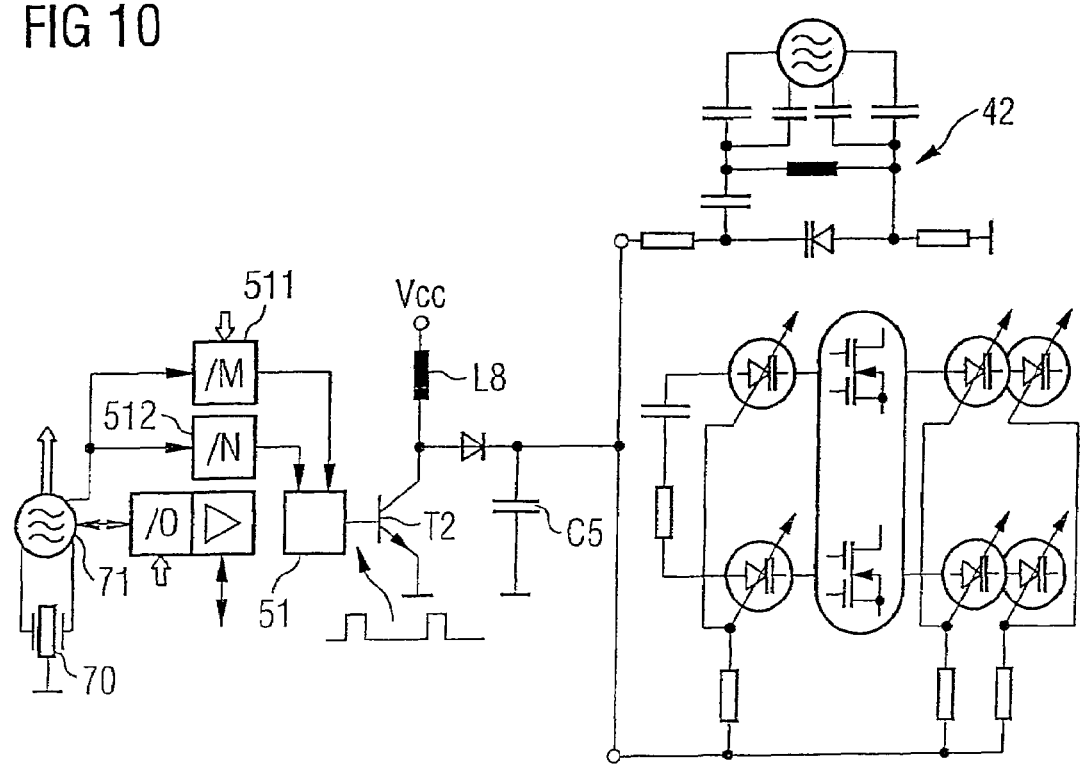
FIG. 10 shows a block diagram for production of the control voltage.
Figure 11:
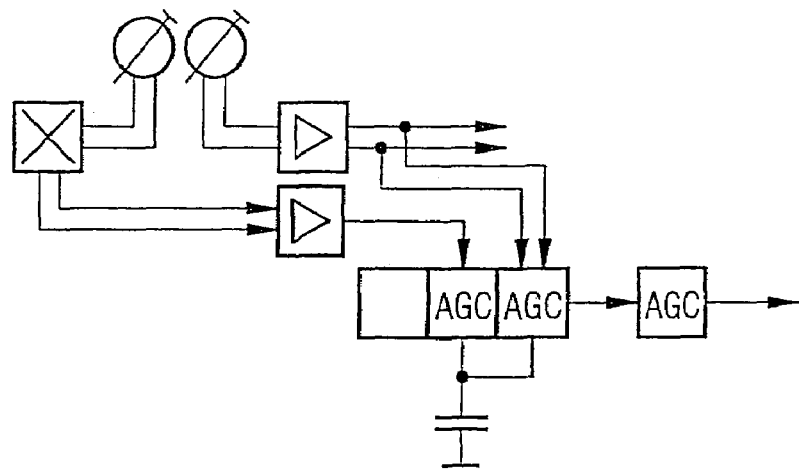
FIG. 11 shows a block diagram with a broadband and a narrowband level detector.

FIG. 10 shows a more detailed embodiment of the charge pump. The frequency of a signal from the reference oscillator 71 is divided by two different division ratios. This is done in the divider circuits 511 and 512. The division ratio in the divider circuits 511 and 512 is freely programmable. The signals are supplied at the divided frequency to a DC/DC converter. The programmable frequency division allows the duty cycle and the clock rate of the signal which is emitted at the output of the DC/DC converter to be adjusted freely. One possible example of a clock rate with a duty cycle of about ⅓ is shown. The clock signal is used by the charge pump, which comprises the coil L8, the diode and the capacitor C5.

Figure 13:
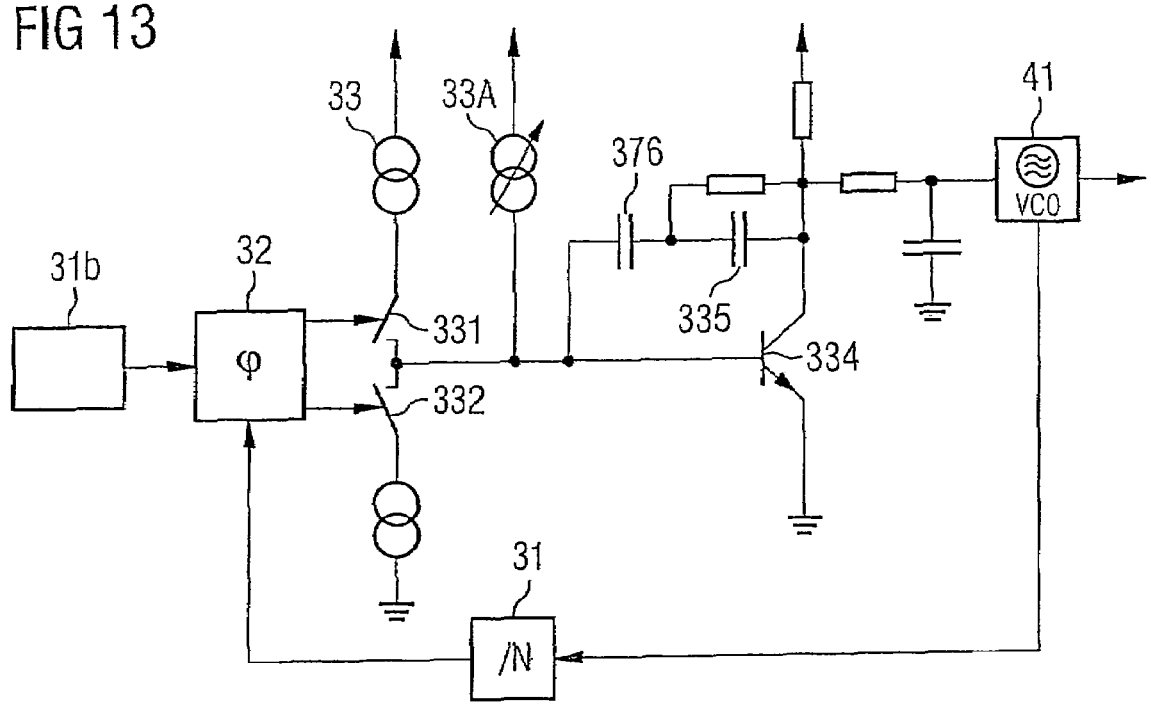
FIG. 13 shows one exemplary embodiment of a phase locked loop in the receiver arrangement.

FIG. 13 shows one exemplary embodiment of a phase locked loop. Since the receiver arrangement can also be used in particular for mobile appliances, it is expedient to switch off power-consuming systems, and to activate them only when required. One particular power-consuming system such as this is the phase locked loop. During normal operation, the phase detector 32 produces an appropriate control signal after comparison of a reference phase with the phase of the fedback signal. In this case, it closes one of the two switches 331 or 332 in the charge pump 33, and thus connects the appropriate potential to the base of the bipolar transistor 334.

The bipolar transistor 334 together with the two capacitors 335 and 336 forms a loop filter for production of a control signal for the voltage controlled oscillator 41. This circuit has the disadvantage of the relatively long time of the control loop which is required after activation of the phase locked loop. An additional charge pump 33a is provided in order to reduce the control time which is required in order to set the voltage controlled oscillator to the desired output frequency. This charge pump 33a is activated during the transient response of the control loop and produces an additional current surge, which increases the control rate. This considerably shortens the overall transient-response time, so that the receiver can disconnect the phase locked loop from the rest of the power supply in an inactive operating mode, in order to reduce the power consumption.

In this exemplary embodiment, the phase locked loop, the oscillators, the mixers and the corresponding amplifier circuits are integrated within a semiconductor body. In the same way, however, the additional filters may also be in the form of an integrated circuit within the semiconductor body. The additional digital/analog converter 4 that is provided allows digital tuning of the tracking filters which are connected upstream of the mixers, in order in this case to compensate for component and manufacturing tolerances. There is thus no need for mechanical trimming to be carried out during manufacture. Various correction values which are specific for the individual frequency ranges can be stored within the EEPROM. It is expedient to provide rewritable memories, and to write the appropriate correction values to them during the manufacturing process, after implementation of the tracking filters.

In consequence, the pass bands and the frequency responses of the tracking filters are defined in detail, appropriate correction values are calculated, and these are stored in the EEPROM memory. During operation, the digital/analog converter reads these values as a function of the selected frequencies to be received and corrects the pass bands and the frequency responses of the tracking filters, using the correction signal, by means of the described foot-point control. The high selectivity of the tracking filters and the wide frequency range of the voltage controlled oscillators 40, 41 allow not only reception of digital television signals, but also of additional mobile radio standards.

In this case, it is not just possible to carry out the conversion process to an intermediate frequency, but, with suitable choice of the local oscillator signal, it is also possible to convert a received signal directly to baseband. The level detection of broadband input signals and the additional level detection of narrow band signals allow specific and high-precision adjustment of the input amplifier 80 and of the intermediate-frequency amplifier 8. Furthermore, the mixers may also have additional amplifying characteristics. The embodiment in the form of an integrated circuit allows the supply voltage to be reduced to below 5V, and in particular to 3V.

LIST OF REFERENCE SYMBOLS

1: Semiconductor body
2, 3: Mixer
6, 6a: Amplifier
7: Surface acoustic wave filter
8: Intermediate-signal frequency amplifier
9: Level detector
10: Control and monitoring device
20: Supply device
31, 31a, 31b: Frequency divider
32: Phase detector
33: Charge pump
40, 41, 71: Voltage controlled oscillators
51: Step-up converter
4: Digital/analog converter
5: Frequency divider
11,12,13,15: Signal inputs
14: Signal outputs
81, 82, 83, 84, 85, 86: Tracking filters
87: Antenna
80: Input amplifier
42, 43: Control circuits
70: Crystal oscillator
C1, C2, C3, C4, C5: Capacitors
R1, R2, R3, R4: Resistors
L1, L2, L9, L8: Coils
91: Filter
Vc: Supply potential
AGC: Control signal LO, LO-: Local oscillator signal
IF, IF-: Intermediate-frequency signal
T1, T2, T11, T12, T21, T22: Bipolar transistors
C11, C12, C21, C22: Capacitors
T31, T41a, T41b, T32,
T51, T52: Transistors
71: Differential amplifier
D1, D2: Varactor diodes
Vt: Adjustment signal
Vk: Correction signal
DAC1, DAC2, DAC3: Digital/analog converter
66a, 66b: Double-ended signal output
61a: Diode
62a: Transistor
63a: Switch
334: Bipolar transistor
331, 332: Switch

The invention claimed is:

1. A receiver arrangement configured to receive television signals, comprising:
   at least one signal path with a connection for coupling to an antenna, the signal path having a frequency conversion device with a signal input, a local oscillator input and an output which is designed for conversion of a signal applied on the input side to an intermediate frequency,
   a first amplifier having a gain that compensates for signal level loss in a filter which is connected downstream from the first amplifier, with the first amplifier being coupled to the output of the frequency conversion device; and
   an intermediate-frequency amplifier with a variable gain factor, which is coupled to the first amplifier;
   with at least the frequency conversion device and the first amplifier being formed in a common semiconductor body, where the signal input of the frequency conversion device is preceded by a first filter device with a variable pass band which has a first and a second control connection for supplying a first and a second control signal for adjustment of the pass band.

2. The receiver arrangement of claim 1, wherein the intermediate-frequency amplifier is formed in the semiconductor body.

3. The receiver arrangement of claim 1, wherein the frequency conversion device is in the form of a Gilbert mixer with a Gilbert cell.

4. The receiver arrangement of claim 3, wherein a first and a second control connection of the Gilbert cell form the local oscillator input, and the first control connection is connected to one connection of a first charge store and to one connection of a second charge store, and the second control connection is connected to one connection of a third charge store and to one connection of a fourth charge store, with the other connection of the first and of the fourth charge store being connected to the second output, and the other connection of the second and of the third charge store being connected to the second output of the frequency conversion device.

5. The receiver arrangement of claim 1, wherein the first filter device is in the form of a tracking filter outside the semiconductor body.

6. The receiver arrangement of claim 1, wherein the first filter device has at least one capacitance diode with a variable capacitance, whose first connection is coupled to the first control connection, and whose second connection is coupled to the second control connection.

7. The receiver arrangement of claim 1, wherein the first filter device has a charge store, which is connected between a signal input and a signal output of the first filter device, for mirror-image frequency suppression.

8. The receiver arrangement of claim 1, wherein the first control connection is designed to supply a control signal for adjustment of the pass band, and the second control connection is designed to supply a correction signal for trimming and for correction of the pass band.

9. The receiver arrangement of claim 8, wherein the second control connection is coupled to a digital/analog converter for foot point adjustment, where the digital/analog converter is designed to convert a digital correction value to an analog correction signal, and to supply the correction signal to the second control connection.

10. The receiver arrangement of claim 9, wherein the digital/analog converter is formed in the semiconductor body.

11. The receiver arrangement of claim 9, wherein the digital correction value is stored in a memory which is coupled to the digital/analog converter.

12. The receiver arrangement of claim 11, wherein the memory comprises at least one of EPROM, EEPROM and FlashPROM.

13. The receiver arrangement of claim 1, wherein the filter is connected downstream from the first amplifier and is in the form of an external filter outside the semiconductor body.

14. The receiver arrangement of claim 1, wherein the first amplifier is coupled via a second filter device to the output of the frequency conversion device.

15. The receiver arrangement of claim 14, wherein the second filter device has a connection for supplying a supply potential, which is coupled via an inductive element to the output of the frequency conversion device.

16. The receiver arrangement of claim 1, wherein the first amplifier is in the form of an impedance converter.

17. The receiver arrangement of claim 15, wherein the second filter device is arranged outside the semiconductor body.

18. The receiver arrangement of claim 1, wherein the filter is connected downstream from the first amplifier and is in the form of a surface acoustic wave filter.

19. The receiver arrangement of claim 1, wherein the filter is connected downstream from the first amplifier and is in the form of an active tunable RC filter with a low-pass or bandpass filter characteristic.

20. The receiver arrangement of claim 1, wherein the filter is connected downstream from the first amplifier and is a control input for supplying a control signal for switching the filter bandwidth of the filter.

21. The receiver arrangement of claim 1, wherein the filter is connected downstream from the first amplifier and has a first and a second input connection, which is coupled to the output of the first amplifier, and the filter is designed with a variable filter bandwidth as a function of the phase difference between signals which are applied to the connections.

22. The receiver arrangement of claim 21, wherein the downstream filter is designed to change its filter bandwidth as a function of a push-pull signal or single ended signal applied to its input side.

23. The receiver arrangement of claim 22, wherein the first amplifier is designed to selectively emit a single ended signal or a push-pull signal.

24. The receiver arrangement of claim 1, wherein the first filter device is preceded by an input amplifier with a continuously variable gain, which has a control input for gain adjustment.

25. The receiver arrangement of claim 24, wherein
the first amplifier is connected to a level detector, which is designed to emit a control signal for adjustment of the gain of the input amplifier.

26. The receiver arrangement of claim 24, wherein
the frequency conversion device is designed to emit a signal which represents an input signal level to a circuit for production of a control signal for adjustment of the gain of the input amplifier.

27. The receiver arrangement of claim 1, wherein
the frequency conversion device has two controlled paths, which are connected between a first and a second potential and whose control connections are connected to the signal input of the at least one frequency conversion device and whose first and second connections are coupled to a threshold value detector to form a broadband level detector.

28. The receiver arrangement of claim 1, wherein
the intermediate-frequency amplifier and the first amplifier have an operating mode with a reduced power consumption, and a control input for supplying a signal for reducing the power consumption.

29. A receiver arrangement configured to receive television signals, comprising:
- a filter with a variable pass band, designed with a first control connection for supplying a first control signal for adjustment of the pass band, and a second control connection for supplying a correction signal for trimming and correction of the pass band, with the correction signal being derived from a digital correction value;
- a frequency conversion device with a signal input, a local oscillator input and an output for conversion of a signal which is applied to the input side to an intermediate frequency, which is connected on an input side of the filter;
- a first amplifier with a gain that compensates for signal level loss in a second filter connected downstream from the first amplifier, with the first amplifier coupled to the output of the frequency conversion device, and
- an intermediate frequency amplifier having a variable gain factor, which is coupled to the first amplifier;
- with the frequency conversion device and the first amplifier being formed in a common semiconductor body.

30. The receiver arrangement of claim 29, wherein
the filter has a charge store connected between a signal input and a signal output of the filter for mirror image frequency suppression.

31. A receiver arrangement configured to receive television signals, comprising:
- at least one signal path with a connection for coupling to an antenna, the signal path having no more than one frequency conversion device with a signal input, a local oscillator input and an output which is designed for conversion of a signal applied on the input side to an intermediate frequency,
- a first amplifier having a gain that compensates for signal level loss in a filter which is connected downstream from the first amplifier, with the first amplifier being coupled to the output of the frequency conversion device; and
- an intermediate-frequency amplifier with a variable gain factor, which is coupled to the first amplifier;
- with at least the frequency conversion device and the first amplifier being formed in a common semiconductor body;
- wherein the intermediate-frequency amplifier and the first amplifier have an operating mode with a reduced power consumption, and a control input for supplying a signal for reducing the power consumption.

\* \* \* \* \*